（12）United States Patent
Kao et al.

(10) Patent No.: US 8,207,532 B2
(45) Date of Patent: Jun. 26, 2012

(54) CONSTANT AND REDUCIBLE HOLE BOTTOM CD IN VARIABLE POST-CMP THICKNESS AND AFTER-DEVELOPMENT-INSPECTION CD

(75) Inventors: Chi-An Kao, Hsin-Chu (TW);
Yung-Chang Chang, Sindian (TW);
Yu-Ping Chang, Taipei (TW);
Ling-Sung Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 1011 days.

(21) Appl. No.: 10/661,793

(22) Filed: Sep. 12, 2003

(65) Prior Publication Data
US 2005/0059251 A1      Mar. 17, 2005

(51) Int. Cl.
*H01L 23/58*      (2006.01)
(52) U.S. Cl. ........... 257/48; 257/E21.252; 257/E21.525; 438/695; 438/700; 438/713; 156/345.24
(58) Field of Classification Search .................. 438/695, 438/700, 713; 216/41, 59; 257/48, E21.252, 257/E21.525, E21.577; 430/30; 156/345.24
See application file for complete search history.

(56) References Cited

U.S. PATENT DOCUMENTS

| | | | |
|---|---|---|---|
| 5,926,690 A | 7/1999 | Toprac et al. | 438/17 |
| 6,161,054 A | 12/2000 | Rosenthal et al. | 700/121 |
| 6,225,134 B1 | 5/2001 | Meisner | 438/7 |
| 6,235,440 B1 | 5/2001 | Tao et al. | 430/30 |
| 6,309,976 B1 | 10/2001 | Lin et al. | 438/706 |
| 6,485,895 B1 * | 11/2002 | Choi et al. | 430/330 |
| 6,561,706 B2 | 5/2003 | Singh et al. | |
| 6,625,512 B1 * | 9/2003 | Goodwin | 700/121 |
| 6,893,974 B1 * | 5/2005 | Sedigh et al. | 438/714 |
| 6,924,088 B2 * | 8/2005 | Mui et al. | 430/313 |
| 2003/0015422 A1 * | 1/2003 | Fritsch et al. | 204/403.01 |
| 2003/0059987 A1 * | 3/2003 | Sirringhaus et al. | 438/149 |
| 2003/0220708 A1 * | 11/2003 | Sahin et al. | 700/121 |
| 2004/0092047 A1 * | 5/2004 | Lymberopoulos et al. | 438/17 |
| 2005/0042523 A1 * | 2/2005 | Wu et al. | 430/5 |

* cited by examiner

*Primary Examiner* — Khiem D Nguyen

(57) ABSTRACT

A new method is provided for the creation of a hole through a layer of insulating material. The method provides for combining a feed-forward method with a feed backward method and a high-polymer based hole profile, in order to establish a hole of a constant Critical Dimension for the hole bottom, making the CD of the hole bottom independent of the CD of the opening created through the overlying developed layer of photoresist and independent of the thickness of the layer of insulator material after CMP has been applied to the surface of the insulation layer.

10 Claims, 5 Drawing Sheets

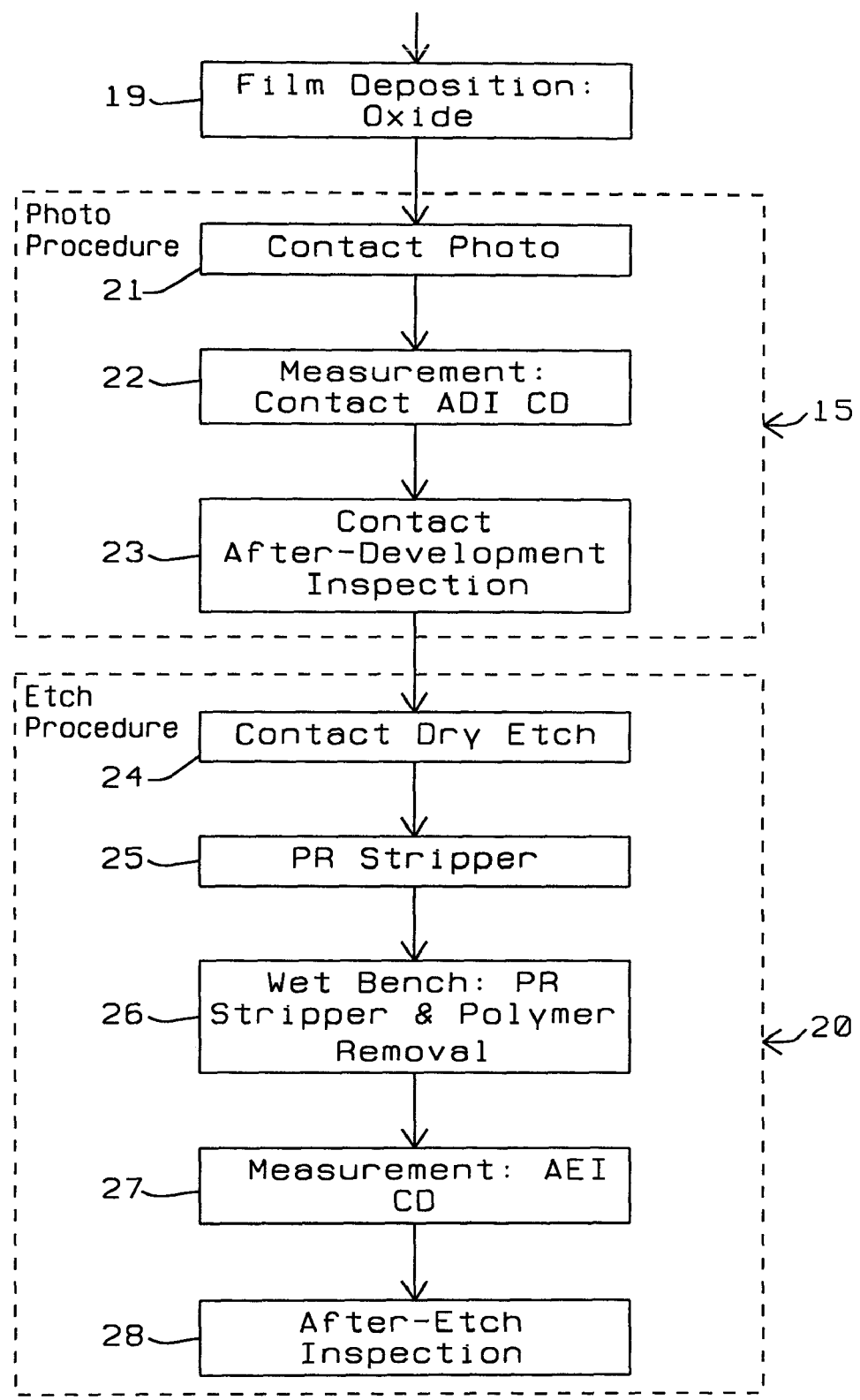
FIG. 1 - Prior Art

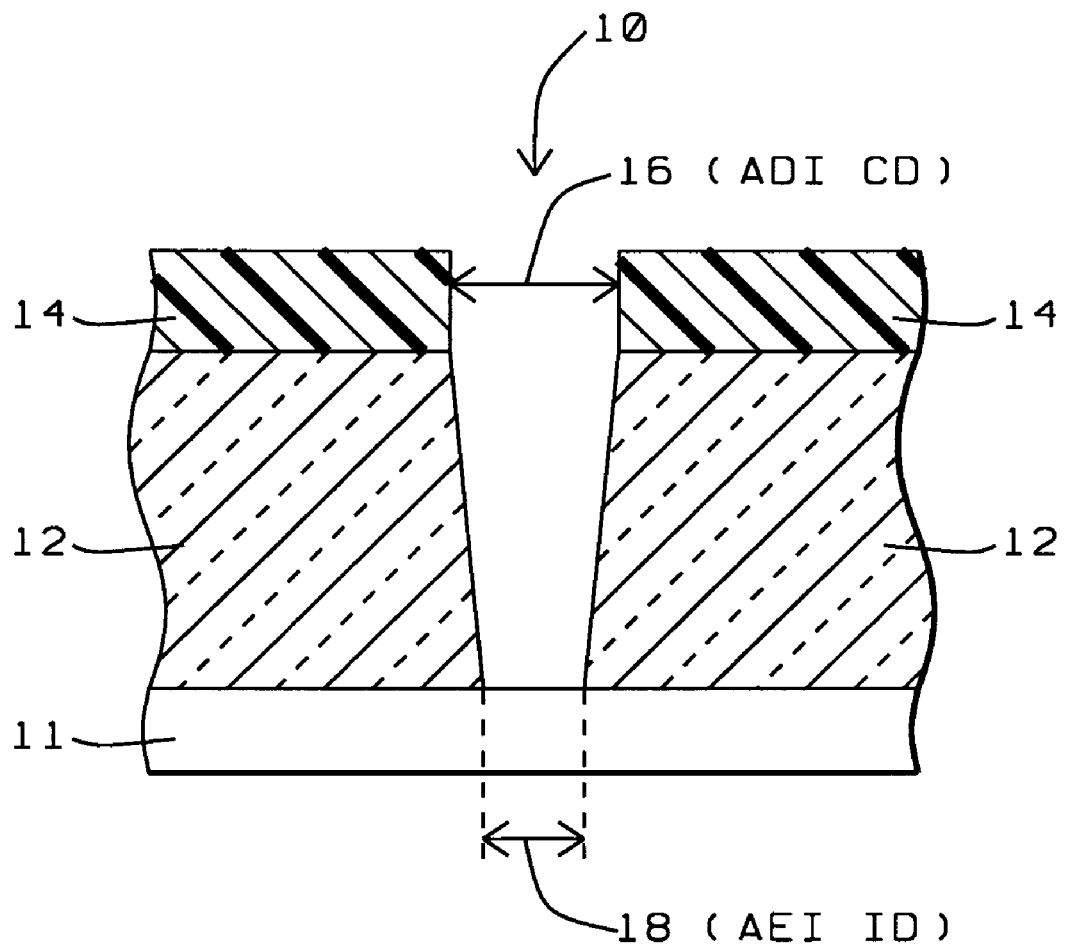
FIG. 2 - Prior Art

CONSTANT AND REDUCIBLE HOLE BOTTOM CD IN VARIABLE POST-CMP THICKNESS AND AFTER-DEVELOPMENT-INSPECTION CD

BACKGROUND OF THE INVENTION (1) Field of the Invention

The invention relates to the fabrication of integrated circuit devices, and more particularly, to a method to combine feed-forward and feed-backward methods and a high-polymer based hole profile in order to achieve a constant and reducible hole bottom.

(2) Description of the Prior Art

The formation of semiconductor devices comprises the formation of numerous device features such as the creation of patterned and etched layer of semiconductor material, the creation of patterns in a deposited layer of semiconductor material, the creation of regions of conductivity in either the surface of a silicon substrate or in deposited layers of semiconductor material, the formation of conductive interconnect traces, and the like. As examples of these processes can be cited the formation of patterned and etched layers of gate oxide and thereover a layer of polysilicon for the formation of gate electrodes, the creation of Lightly Doped Diffusion and source/drain regions in the surface of a substrate self-aligned with created layers of gate electrode material and the doping of a layer of polysilicon in order to provide the desired conductivity to this layer of polysilicon for use as for instance a layer of gate electrode material. These and other processes of creating device features are subject to Critical Dimension (or minimum width) control, which is a reflection of the accuracy that is achieved by the creative process that may comprise using photolithographic technology with exposure masks or reticles, layers of photoresist for the exposure of surfaces that need to be etched, etc. For reasons of wafer and device throughput and device performance, the variation of the Critical Dimension must be within strict and well-established limits. Any deviation from this limit leads to product rework or product rejection, both courses of action adding to the final product cost and must therefore be avoided wherever possible.

In many cases, deviation from the allowable CD limit is determined at the level of photoresist development. Where product that is being created is detected to not meet the CD limit at the photoresist development stage, most commonly the developed layer of photoresist is removed and the cycle of product creation is restarted with a new layer of photoresist. This is an approach that in again leads to increased product cost and in addition does not provide for prevention of a repetition of the experienced problem, since no feedback mechanism is applied to perhaps correct the exposure of the layer of photoresist prior to the re-development of the layer of photoresist.

The invention specifically addresses the creation of openings, which may be via openings or contact openings. A conventional method of creating such openings applies and develops a layer of photoresist, which has been coated over the surface of a layer of semiconductor material, and measures the CD of the opening created in the layer of photoresist. For product that passes this measurement, the process continues with the etching of the layer of semiconductor material in which the opening is to be created, after which the developed layer of photoresist is removed. Accumulated impurities, such as remnants of photoresist or polymers, are then removed after which the CD of the created opening is measured. Most openings are created through a layer of insulation or dielectric, as a final operation the surface of the layer of dielectric may be polished in order to assure good planarity, which is of particular importance in order to maintain good planarity for thereover created layers and device features.

The conventional method as highlighted above does not make use of any in-process feedback loops that dynamically, real-time correct for errors that are present in the cycle of creating openings, as confirmed by failure to meet CD specifications. The invention addresses this concern.

U.S. Pat. No. 5,926,690 (Toprac) shows a run-to-run control process for controlling Critical Dimension. It can reduce the impact from After Development Inspection (ADI) DC, but not the post CMP thickness.

U.S. Pat. No. 6,225,134 (Meisner) teaches a method for linewidth control.

U.S. Pat. No. 6,309,976 B1 (Lin et al.) shows a CD control method including an After Development Inspection (ADI).

U.S. Pat. No. 6,235,440 B1 (Tao et al.) shows a gate CD control method including an ADI.

U.S. Pat. No. 6,161,054 (Rosenthal et al.) teaches a cell control method.

SUMMARY OF THE INVENTION

A principle objective of the invention is to prevent the impact of the CD of the opening created through the layer of photoresist on the CD of the hole that is etched through a layer of dielectric.

Another objective of the invention is to prevent the impact of the thickness of the post CMP layer of dielectric (through which a hole is created) on the CD of the hole after the hole is etched through the layer of dielectric.

Yet another objective of the invention is to provide a method that allows for the reduction of the CD of the hole that is etched through a layer of dielectric from a CD of the hole created through an overlying layer of photoresist A still further objective of the invention is to provide a method that assures a constant CD of the hole etched through a layer of dielectric, independent of the CD of the hole created through the layer of developed photoresist and independent of the thickness of the after-CMP layer of dielectric.

In accordance with the objectives of the invention a new method is provided for the creation of a hole through a layer of insulating material. The method provides for combining a feed-forward method with a feed backward method and a high-polymer based hole profile, in order to establish a hole of a constant Critical Dimension for the hole bottom, making the CD of the hole bottom independent of the CD of the opening created through the overlying developed layer of photoresist and independent of the thickness of the layer of insulator material after CMP has been applied to the surface of the insulation layer.

BRIEF DESCRIPTION OF THE DRAWINGS

FIG. 1 shows a conventional processing flow for the creation of a hole through a layer of insulation.

FIG. 2 shows a conventional cross section of a contact hole created through a layer of insulation.

DESCRIPTION OF THE PREFERRED EMBODIMENTS

Figure 3A:
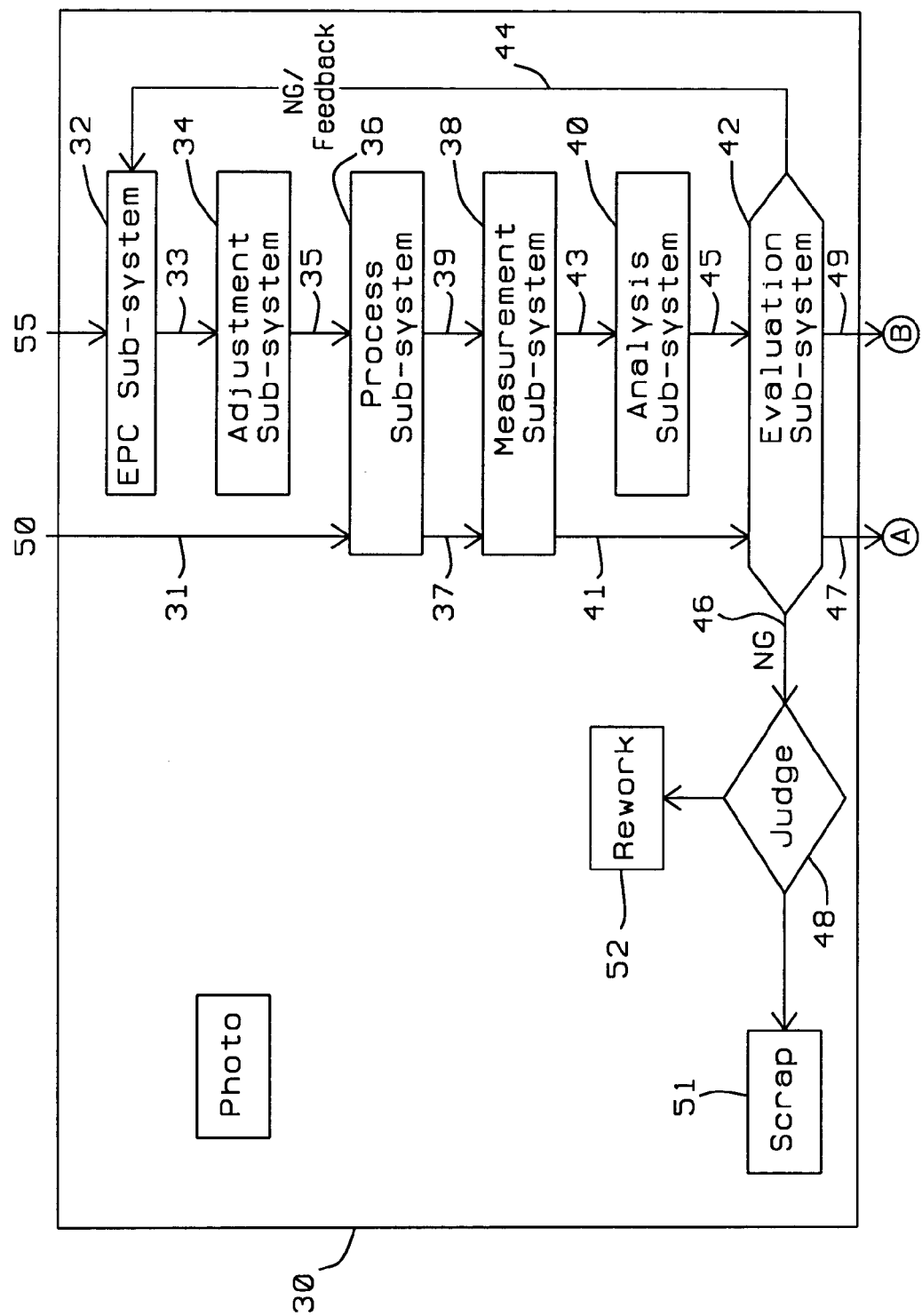
FIGS. 3a and 3b shows the processing flow of the invention for the creation of a hole through a layer of insulation.

Referring first to the flow chart that is shown in FIG. 1, this flowchart is the conventional processing flow that is used for the creation of an opening through a layer of insulation. This flow chart is divided in two sections, section 15 that represents the procedure relating to the processing of a layer of photoresist that serves of a photoresist mask over the layer of insulation. Section 20 represents the etch procedure that is applied for the etching of the hole through the layer of insulating material.

Prior to section 15, a layer of insulation material has been created as has been highlighted by the block that states: Film Deposition: oxide.

Section 15 of the flow-chart of FIG. 1 is preceded by step 19, which indicates the deposition of a layer of dielectric insulation such as oxide in the surface of which an opening is to be created. A layer of photoresist is for this purpose first coated over the surface of the layer of oxide, as highlighted under section of the flow-chart of FIG. 1.

Under section 15 are highlighted the successive steps of:
21, Contact photo, which comprises:
depositing (coating) a layer of photoresist over the surface of the layer of insulation material
patterning and developing the layer of photoresist, creating an opening through the layer of photoresist, exposing the surface of the layer of insulating material where the hole has to be created through this layer
22, Measurement, Contact After Development Inspection (ADI) CD; the CD of the opening that has been created through the developed layer of photoresist is measured, and
23, Contact after development inspection; the opening created through the layer of photoresist is further visually inspected.

The processing that has been highlighted under section 15 continues with the processing of section 20, FIG. 1, the etch procedure. Highlighted therein are the steps of:
24, Contact Dry Etch, the actual etching of the hole through the layer of insulating material
25, PR stripper, the photoresist mask is removed from the surface of the layer of insulating material
26, Wet Bench: PR Stripper and Polymer Removal, any unwanted chemicals such as the stripper that has been used for the removal of the photoresist mask and accumulated polymers are removed from the surface of the layer of insulating material
27, Measurement: After Etch Inspection CD; the CD of the created hole is measured
28, After-Etch Inspection; the surface of the layer of insulating material in which the hole has been created is visually inspected.

To further establish common standards and understanding, the hole that has been created through the layer of insulating material is shown in cross section in FIG. 2, wherein are highlighted:
10, the hole that has been created through the layer of insulating material
11, a semiconductor surface, typically the surface of a silicon semiconductor substrate, over which the layer 12 of insulating material has been deposited
12, the layer of insulating material through which hole 10 has been created
14, the layer of photoresist mask, used for the creation of opening 10, overlying the surface of the layer 12 of insulating material
16, the After Development (of the layer 14 of photoresist) Inspection CD (ADI CD), and
18, the After Etch (of the layer 12 of insulating material) Inspection CD (AEI CD).

The following objectives and methods are described next, these are the objective of the invention:
to prevent that the (photoresist) ADI CD has an impact on the (insulation material) AEI CD
to prevent that the post-CMP thickness of the layer of insulation through which the hole is created has an impact on the (insulation material) AEI CD
to provide for reduced (insulation material) AEI CD, which is reduced from the (photoresist) ADI CD, and
to prevent that a variable (photoresist) ADI CD and variations in the post-CMP thickness of the layer of insulation have an impact on the (insulator material) AEI CD.

Figure 3B:
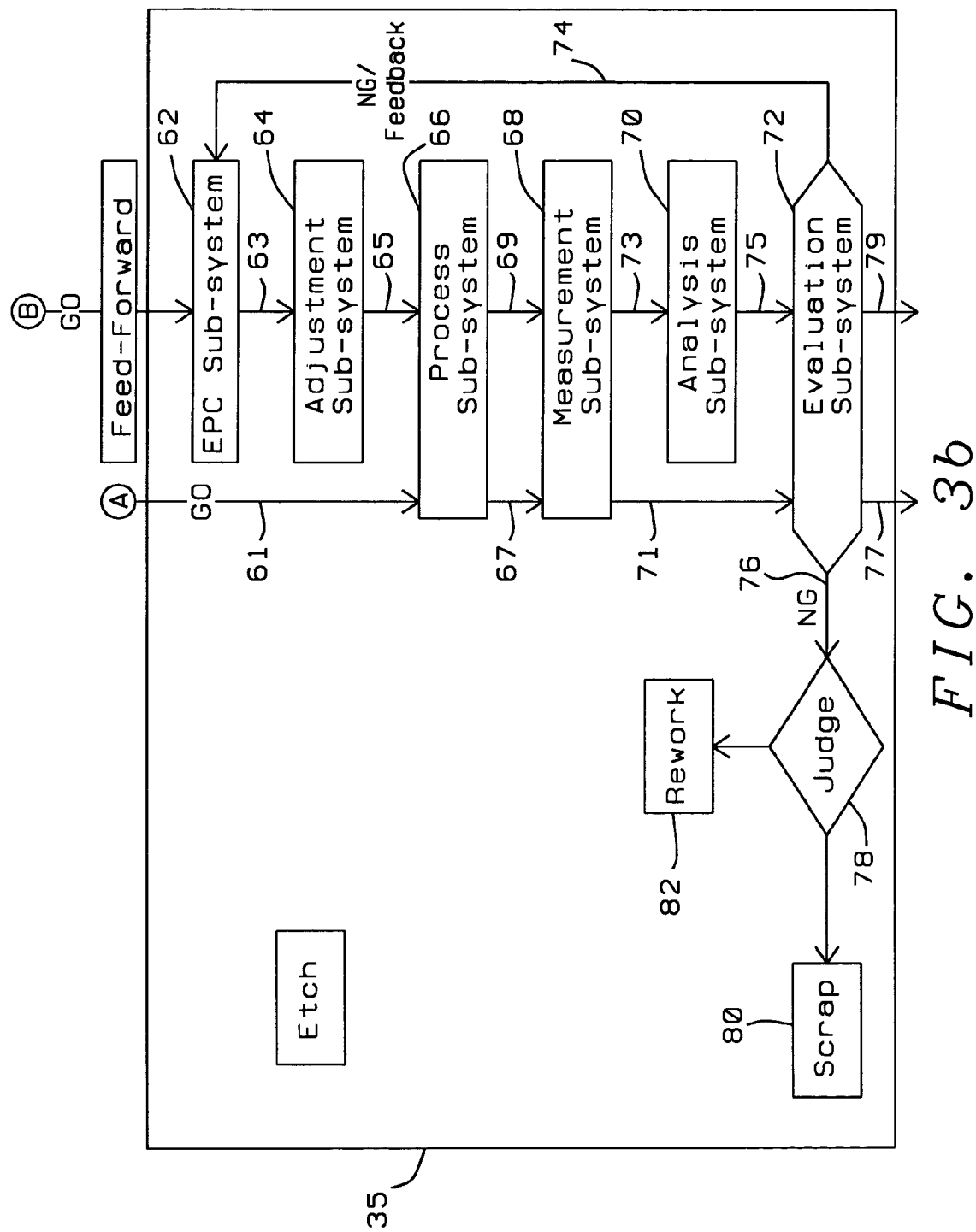

The invention will now be described in detail using the flow diagram that is shown in FIGS. 3a and 3b. The flow diagram of FIG. 3a is from a semiconductor processing point of view subdivided in an photoresist control function 30 and an etch control function 35. Since both (photoresist processing and insulation layer etch processing) of these functions under the invention comprise functions that relate to product flow and functions that relate to information flow, the two functions 30 and 35 are functionally divided in:
1. product flow functions that take effect in accordance with and as an extension of the product flow line 50 through both the photoresist functions 30 and the etch function 35 in a vertical direction, and
2. information flow functions that take effect in accordance with and as an extension of the product flow line 55 through both the photoresist functions 30 and the etch function 35 in a vertical direction.

As an introductory note must be highlighted that the Engineering Process Control (EPC) software support system is used for the performance of numerous functions of control, data collection, feedback and feed-forward of data, tool control, product scheduling and many other and related functions that are required to control a semiconductor manufacturing facility. These functions are assumed to be comprised within the EPC, whereby however the invention does not relate to or affect most of these functions. The invention limits itself to providing a photoresist control function 30 and an etch control function 35, whereby both of these functions are sub-functions of the EPC system and are therefore under control of the EPC system.

Referring now specifically to the flow diagram of FIG. 3a, the photoresist function 30 is invoked, entry 32, as a sub-function of the EPC system and, after invocation by the photoresist control function 30, is linked via software link 33 (branch-to) with the adjustment sub-system 34. The adjustment sub-system 34 controls and manages all data that is related to the creation of an opening, such as opening 10 of FIG. 2, through a layer of photoresist. For instance, the adjustment sub-system 34 provides all parameters of control that are required for the creation of an opening of a desired CD within the constraints of the applicable design rules. These parameters of adjustment sub-system 34 are provided (inputted, possibly via register storage and access), via software interface 35 to the process sub-system 36.

The data that are maintained by the adjustment sub-system 34 are, under the invention, not restricted to being static data that do not change with time. The dynamics of a processing control environment, as provided by the invention, most particularly where this process control environment applies to the fabrication of holes that form part of semiconductor devices, requires that data are real-time updated based on real-time process control requirements.

For instance, if, under the invention, it is determined that a particular parameter, such as the parameter ADI CD, is not within limits for the process environment at the time that this parameter is applied to the process, then it is provided by the invention that this parameter is adjusted in order to better meet design and fabrication limits.

This in fact is the principle that is provided by the invention, specifically the control and adjustment of the parameters ADI CD and AEI CD on a real time basis and driven by deviation of these parameters from desired or optimum values.

If therefore for instance a parameter ADI CD is provided to and applied by the processing tool, and if it is determined that this parameter creates an opening that is not within ADT CD limits, then a correction is made to the original value of ADI CD in a manner such that it is reasonable to expect that the corrected parameter will now create an opening that is as expected (that is: within design limits).

It must further be stated that optimization of a parameter may comprise methods of verification and correction that use a range of mathematical disciplines and may for instance partially or completely depend on statistical analysis, numerical analysis of available data and the impact thereon of new measurement data, and the like. It is clear that any data manipulation has as objective the creation of optimum data, taking into account existing data, historical records that are relevant, measurement data or otherwise provided data or any category of data that is of importance in meeting the objective of creating optimum data for a particular function.

The data that are provided by the adjustment sub-system are submitted via software link 35 to the process sub-system which now applies these data in order to create an opening through a layer of photoresist. Of prime importance in the data that is provided by the process sub-system 36 is the ADI CD, that is the Critical Dimension of the diameter of the opening that is created The process sub-system 37, then, that is after an opening has been created through the layer of photoresist, invokes via software link 37 the Measurement sub-system 38. The latter system 38, is also, via software link 39, provided with the relevant data that relates to the creation of the opening through the layer of photoresist, as a minimum with the value of ADI CD although additional data, such as the time of day, the tool ID and further processing related data may be included in the data that is provided by the process sub-system 36 to the measurement sub-system 38.

The measurement sub-system 38 is now, from a processing point of view invoked and directed to measure, the ADI CD of the opening that has been created through the layer of photoresist. This data, after the measurement has taken place, is combined in the measurement sub-system 38 with the record 39 that has been provided by the process subsystem 36 to the measurement sub-system 38. These combined records are submitted, via software link 43, to the analysis sub-system 40, which essentially determines the extent by which the created value of ADI CD deviates from the measured value of ADI CD.

The outcome of this analysis provides a critical result, which indicates whether the opening created through the layer of photoresist is or is not within acceptable tolerance. For product where the latter deviation is within limits, the evaluation sub-system 42 passes the created product via process flow link 47 and via information flow link 49 to the etch control function 35.

For product that does not meet limits (the ADI CD is not within specification or tolerance) the evaluation sub-system 42 rejects the product via combined product flow and information flow link 46, after which a decision can be reached, function 48 of flow diagram FIG. 3a, to either rework the product (52) or the scrap the product (51).

For product that does not meet limits (the ADI CD is not within specification or tolerance) the evaluation sub-system 42 re-routes the data related to that product, via software link 44, to the entry point 32 of the photoresist control function 30 from where the data is advanced to the adjustment sub-system 34. It is realized that at this time all the relevant data that relates to the creation of an opening through a layer of photoresist is available: the desired ADI CD, the actual ADI CD, supporting data such as time of day, potentially processing conditions, tool used, etc. It is from this clear that the adjustment sub-system 34 can now make a desired determination that provides correction(s) to the controlling data, most notably to the value of ADI CD that must be created.

To put this simply: if the opening (ADI CD) that has been created is too small, a correction is implemented to this too small an opening such that a larger opening (ADI CD) will be created. This value for the (larger opening ADI CD) replaces the previous value and is now used for the (next) creation of an opening through the layer of photoresist.

It is clear from the above that with the various software components that operate in combination with and in support of the product flow functions, the opening that is created through the layer of photoresist will rapidly be corrected such that an opening that is within limits will be created.

A review and comparison of the photoresist control function 30 with the etch control function 35 reveals that all blocks of control for both the product flow 50 and the information flow 55 are identically described. This identity between the two control functions 30 and 35 will turn out to be not accidental since both functions are provided with the objective of manipulating the CD of an opening based on comparing actual CD values with desired CD values.

Since therefore the two functions 30 and 35 coincide to a considerable degree in process and informational design and implementation, the etch control block 35 will be described in a somewhat simplified format as compared with the previous description of the photoresist control block 30, perhaps gaining in both brevity and clarity of the description of the etch control function 35. It must thereby however be understood that all functional capabilities and lack of processing restraints as they have previously been described for the photoresist control function 30 equally apply to the etch control function 35 and are hereby incorporated by reference.

Again referring specifically to the flow diagram of FIG. 3b, the etch function 35 is invoked after completion of the photoresist function 30, as follows:

for purposes of information flow, at entry point 62, the etch function 35 is invoked as a sub-function of the EPC system, via software link (branch-to) 49 and for purposes of product flow, the etch function 35 is invoked via interconnect 47; this latter interconnect indicates that there is no lack of continuity of the conventional method of creating an opening through a layer of dielectric after an opening has been created through a thereover deposited layer of photoresist After invocation of the etch control function 35:

the function is linked via software link 63 (branch-to) with the adjustment sub-system 64. The adjustment sub-system 64 controls and manages all data related to the creation of an opening, such as opening 10 of FIG. 2, through a layer of insulation material 12, FIG. 2, most notably parameter AEI CD (parameter 18, FIG. 2); the following must hereby be emphasized as a key aspect of the invention: the adjustment sub-system 64 is designed such that any parameter, such as preferably the ADI-CD, can be manipulated by this sub-system and can readily be converted to for instance a smaller value which can now take the place of the AEI-CD; in other words: if an opening of a certain ADI-CD has been created through a layer of photoresist and it is desired to create a therewith related but smaller opening through an underlying layer of insulation, then the adjustment sub-system 64 reduces ADI-CD by a factor, creating a (now smaller) value that becomes the value for AEI-CD; this explains the tapering of the upper section of opening 85, which is shown in cross section in FIG. 4 and which will be discussed at a later time parameters of adjustment sub-system 64 are provided, via software interface 65 to the process sub-system 66 the process sub-system 66 applies these data, most notable AEI CD, in order to create an opening through a layer of insulation the process sub-system 66 invokes via software link 69 the measurement sub-system 68 after an opening has been created through the layer of insulating material the measurement sub-system 68, is via software link 69, provided with the relevant data that relates to the creation of the opening through the layer of insulating material, most notably although not limited to the value of ADI CD the processing branch (also referred to as the product flow branch) of the measurement sub-system 68 is invoked and directed to measure, the actual AEI CD of the opening that has been created through the layer of insulation material the latter data, after the measurement has taken place, is combined in the measurement sub-system with the record 69 that has been provided by the process sub-system 66 to the measurement sub-system 68 the combined records are submitted, via software link 73, to the analysis sub-system 70, which determines the extent by which the provided value of AEI CD deviates from the measured (or actual) value of AEI CD for product where the latter deviation is within limits, the evaluation sub-system 72 will pass the created product via process flow link 77 and via information flow link 79 to the next processing step (not shown)

for product that does not meet limits and is not considered re-workable, (the AEI CD is not within specification or tolerance) the evaluation sub-system 72 rejects the product via combined product flow and information flow link 76, after which a decision can be reached, function 78 of flow diagram FIG. 3b, to either rework the product (82) or to the scrap the product (80)

for product that does not meet limits and is considered re-workable (the AEI CD is not within specification or tolerance) the evaluation sub-system 72 re-routes the data related to that product, via software link 74, to the entry point 62 of the etch control function 35 from where the data is advanced to the adjustment sub-system 64 if the opening (AEI CD) that has been created is too small, a correction is implemented to this too small an opening such that a larger opening (AEI CD) will be created. This value for the (larger opening AEI CD) replaces the previous value and is now used for the (next) creation of an opening through the layer of photoresist; the inverse applies for an opening that has been created and that is too large.

It is clear from the above that with the various software components that operate in combination with and in support of the product flow functions, the opening that is created through the layer of insulation material will rapidly be corrected such that an opening that is within limits will be created.

It is further clear that a value of AEI CD (for the hole through the layer of insulation) can be readily determined by adjustment sub-system 64 based on a value of ADI-CD (the hole created through the layer of photoresist).

Figure 4:
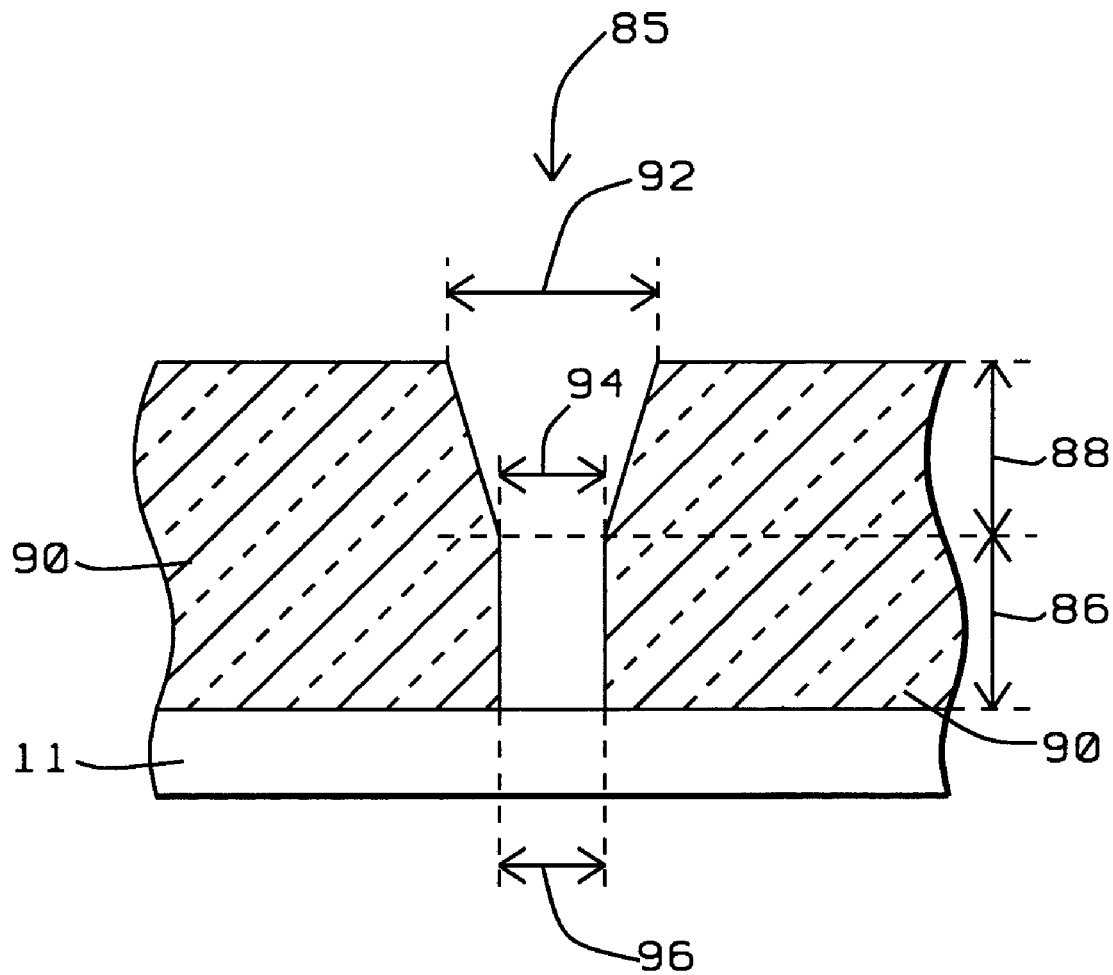
FIG. 4 shows a cross section of a hole, created using the invention, using a high-polymer based step for the top-slope profile of the hole and creating a vertical profile for the bottom-slope.

The above photoresist control function provides the ability to create an opening through a layer of photoresist, of diameter ADI CD, within acceptable limits. The above etch control function provides the ability to create an opening through a layer of insulating material, of diameter AEI CD, within acceptable limits. The invention now applies these capabilities by providing a process that allows for the creation of a hole having an upper section with sloping sides and a lower section with vertical sides. A cross section of this opening is shown in the cross section of FIG. 4. In the cross section that is shown in FIG. 4, the upper section of opening 85 has been highlighted as being section 88, the lower section of opening 85 has been highlighted as being section 86. The opening is created through a layer 90 of insulation material applying a high-polymer based step. The parameter highlighted as parameter 92 is the now familiar ADI CD, the parameter highlighted as parameter 94 is AEI CD. The parameter 96 is the AEI CD of the bottom of the lower section 86 of the opening, for vertical sidewalls of this lower section the parameter 96 (referred to as AEI1 CD) will be equal in value to the parameter 94 (referred to as AEI2 CD).

The method that is provided for the creation of the opening 85 through the layer of insulating material 90 is as follows:
the upper section 88 of the opening is created by applying a timed high polymer dry etch, for example using a higher carbon/fluorine ratio gas as the etchant gas, and
the lower section 86 of the opening is created by applying a low polymer dry etch, for example using a lower carbon/fluorine ratio gas as the etchant gas.

The first of these two etch steps is a high-polymer based step and creates the tapered sidewalls of the upper section 88 of opening 85. The second of these two etch sequences, being an anisotropic etch, creates the vertical sidewalls of the lower section 86 of opening 85.

It must further be pointed out and realized that loop 44, FIG. 3b, is an information loop while loop 46, FIG. 3b, is the product flow loop.

The invention can be summarized as follows:
1. the invention eliminates the impact that ADI CD potentially has on AEI CD by correcting ADI CD before AEI CD is created
2. the invention provides for the creation of an AEI CD that is independent of the thickness of the layer of insulation through which the opening is created after the layer has been polishing using methods of CMP; the AEI CD is set and controlled by the invention, any CMP applied before creation of the hole does not affect the value of the AEI CD
3. for a given value of ADI CD, the value of AEI CD can be reduced (or increased if that is desired) in accordance with an equation that provides for a relation between ADI CD and AEI CD; therefore, the value of AEI CD can be reduced (or increased) relative to the value of ADI CD
4. a constant value of AEI CD can be maintained independent of the value of ADI CD; the values of ADI CD and AEI CD can be independently controlled and adjusted 5. by providing a processing sequence, the invention has provided for an opening of tapered upper sidewalls and vertical lower sidewalls, and 6. by providing for reduced AEI CD, the invention provides for widening of the photolithographic exposure window; reduced AEI CD allows for closer spacing between adjacent openings which allows for more tolerances in creating closely spaced openings.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A system for creation of an opening of controllable format through a layer of insulation material, comprising:
    means for creating an opening through a layer of etch resist material provided over the surface of a layer of insulating material having been deposited over the surface of a substrate;
    means for measuring an obtained critical dimension measurement of said opening created through said layer of etch resist material;
    means, including a feedback mechanism, for assuring that the obtained critical dimension measurement of said opening created through said layer of etch resist material is within design specification, said feedback mechanism communicating with said means for creating an opening through a layer of etch resist material to control said critical dimension measurement of said opening by implementing corrections in said means for creating an opening through a layer of etch resist material;
    means for creating an opening through said layer of insulation material, whereby a diameter of said opening through said layer of insulation material is dependent on a diameter of said opening created through said layer of etch resist material; and
    means, including a feedback mechanism, for assuring that said opening created through said layer of insulation material is within design specification.

2. The system of claim 1, said means, including a feedback mechanism, for assuring that an obtained critical dimension measurement of said opening created through said layer of etch resist material is within design specification comprising:
    means for linking to a software supervisory function, thereby including data transmission functions;
    means for linking to a software function equally being linked to a software supervisory function, thereby including data transmission functions;
    means for data manipulating capabilities, thereby including manipulating interdependent data;
    means for interfacing with semiconductor equipment, thereby including equipment functioning in a supporting role to said semiconductor equipment; and
    means for creating instructions for said semiconductor equipment, thereby including equipment functioning in a supporting role to said semiconductor equipment.

3. The system of claim 1, said means for assuring that said opening created through said layer of insulation material is within design specification comprising:
    means for linking to a software supervisory function, thereby including data transmission functions;
    means for linking to a software function equally being linked to a software supervisory function, thereby including data transmission functions;
    means for data manipulating capabilities, thereby including manipulating interdependent data;
    means for interfacing with semiconductor equipment, thereby including equipment functioning in a supporting role to said semiconductor equipment; and
    means for creating instructions for said semiconductor equipment, thereby including equipment functioning in a supporting role to said semiconductor equipment.

4. The system of claim 1, further comprising means for creating an opening having non-linear sidewalls through a layer of insulation material by applying a high-polymer based etch to the surface of said layer of insulation material.

5. A system for creation of an opening of controllable format through a layer of insulation material, comprising:
    means for software processing capabilities, said software processing capabilities comprising;
    (i) first software processing capabilities being photoresist processing based; and
    (ii) second software processing capabilities being insulating layer etch based;
    means for providing a parameter having a first value of After Development Inspection Critical Dimension (ADI CD) to said first software processing capability, said ADI CD being a diameter of an opening being created through a layer of photoresist;
    means for evaluating issuance of a first instruction, comprising:
    (i) a first instruction having been issued, modifying said first value of ADI CD based on said first instruction, creating a second value of ADI CD; and
    (ii) no first instruction having been issued, converting said step of evaluation for a first instruction having been issued into a no-op or void step;
    means for coating a layer of photoresist over the surface of said layer of insulation material;
    means for developing said layer of photoresist, creating an opening having a diameter of a second value of ADI CD through said layer of photoresist;
    means for measuring said second value of ADI CD;
    means for determining a first difference between said second value of ADI CD and said first value of ADI CD;
    means for creating said first instruction based on said first difference, said first instruction comprising:
    (i) continuing processing said substrate, said instruction of continue processing said substrate being indicative of said first difference being less than a first ADI CD inspection limit, said continue processing said substrate proceeding with a subsequently specified step of providing a parameter having a value of said second value ADI CD to said second software processing capability;
    (ii) removing said developed layer of photoresist from the surface of said layer of insulation material, further invoke said step of modifying said first value of ADI CD based on said first instruction, said first value of ADI CD of said modifying taking on the value of said second value of ADI CD, followed by said steps specified herein following said step of evaluating issuance of a first instruction, said instruction of invoke said modifying said first value of ADI CD based on a first instruction being indicative of said first difference being less than a first ADI CD inspection limit;
    (iii) discontinuing processing said substrate, said instruction of discontinue processing said substrate being indicative of said first difference being more than a second ADI CD inspection limit, said instruction of discontinue processing said substrate further being indicative of a judgment that processing said wafer must be discontinued;

means for executing said first instruction;

means for providing a parameter having a value of said second value ADI CD to said second software processing capability;

means for first modifying said second value of ADI CD based on an equation, creating a first value of After Etch Inspection Critical Dimension (AEI CO);

means for evaluating issuance of a second instruction, comprising:

(i) a second instruction having been issued, modifying said first value of AEI CD based on said second instruction, creating a second value of AEI CD; and (ii) no second instruction having been issued, converting said step of evaluation for a second instruction having been issued into a no-op or void step;

means for etching an opening having a diameter of a second value of AEI CD through said layer of insulation;

means for measuring said second value of AEI CD;

means for determining a second difference between said second value of AEI CD and said first value of AEI CD;

means for determining said second instruction based on said second difference, said second instructions comprising:

(i) continuing processing said substrate, said instruction of continue processing said substrate being indicative of said first difference being less than a first AEI CD inspection limit, said continue processing said substrate resulting in termination of said second software processing, thereby releasing said substrate for additional processing not under control of said first and second software processing capabilities;

(ii) invoking said second modifying said first value of AEI CD based on a second instruction, said first value of said second modifying of AEI CD taking on the value of said second value of AEI CD, followed by said steps specified herein following said step of second modifying said first value of AEI CD based on a second instruction, said instruction of invoke said modifying said first value of AEI CD based on first instructions being indicative of said first difference being less than a first AEI CD inspection limit;

(iii) discontinuing processing said substrate, said instruction of discontinue processing said substrate being indicative of said first difference being more than a second ADI CD inspection limit; and means for executing said second instruction.

6. The system of claim 5, said first software processing capabilities comprising:

means for linking to a supervisory software function;

means for accepting first data from and providing first data to said supervisory software function, thereby including data of ADI CD and AEI CD;

means for calculating data, creating first output data, based on first input data and in accordance with a first relationship as embodied in a first equation between said first input data and said first output value for ADI CD based on a first input value of ADI CD;

means for providing to and accepting from photoresist processing equipment data that relate to photoresist processing, thereby including a value of ADI CD;

means for providing to and accepting from photoresist related processing equipment instructions of or relating to performance of operations by said photoresist related processing equipment, thereby including an instruction to measure a diameter of an opening created through said layer of photoresist, thereby further including receiving first measurement results of a first diameter of a first opening created through said layer of photoresist;

means for calculating a first difference between numerical values, thereby included calculating a first difference between a first value of ADI CD and a measured value of ADI CD;

means for evaluating results obtained by said calculating a first difference between numerical values; and means for creating first instructions relating to said first software processing capabilities being photoresist processing based, thereby including first instructions of terminating photoresist processing, of continuing photoresist processing or of invoking said function of calculating data, creating output data of said first software processing capabilities.

7. The system of claim 5, said second software processing capabilities comprising:

means for linking to said first software processing capabilities;

means for accepting second data from and providing second data to said second software processing capabilities, thereby including data of ADI CD and AEI CD;

means for calculating data, creating second output data, based on second input data and in accordance with a second relationship as embodied in a second equation between said second input data and said second output data, thereby including calculating a first output value for AEI CD based on a first input value of ADI CD, thereby further including calculating a second output value for AEI CD based on a second input value for AEI CD;

means for providing to and accepting from etch processing equipment data that relate to etch processing, thereby including a value of ADI CD, thereby further including a value of AEI CD;

means for providing to and accepting from etch related processing equipment instructions of or relating to performance of operations by said etch related processing equipment, thereby including an instruction to measure a diameter of an opening created through said layer of insulation material, thereby further including receiving first measurement results of a first diameter of a first opening created through said layer of insulation material;

means for calculating a second difference between numerical values, thereby included calculating a second difference between a first value of AEI CD and a measured value of AEI CD;

means for evaluating results obtained by said calculating a second difference between numerical values; and means for creating second instructions relating to said second software processing capabilities being etch processing based, thereby including second instructions of terminating etch processing, of continuing etch processing or of invoking said function of calculating data, creating output data of said second software processing capabilities.

8. A system for creation of an opening of controllable format through a layer of insulation material, comprising:

means for creating an opening through a layer of etch resist material provided over the surface of a layer of insulating material having been deposited over the surface of a substrate;

means, including a feedback mechanism, for obtaining a critical dimension measurement of said opening created through said layer of etch resist material and assuring that said critical dimension measurement is within design specification, said feedback mechanism communicating with said means for creating an opening through a layer of etch resist material to control said critical dimension measurement of said opening;

means for creating an opening having non-linear sidewalls through said layer of insulation material by applying a high-polymer based etch to the surface of said layer of insulation material, whereby a diameter of opening having non-linear sidewalls is dependent on a diameter of said opening created through said layer of etch resist material; and means, including a feedback mechanism, for assuring that said opening created through said layer of insulation material is within design specification.

9. A system for creation of an opening of controllable format through a layer of insulation material, comprising:

means, including a feedback mechanism, for creating an opening through a layer of etch resist material provided over the surface of a layer of insulating material having been deposited over the surface of a substrate, such that the opening has a critical dimension measurement that is within design specification, said feedback mechanism communicating with said means for creating an opening through a layer of etch resist material to control said critical dimension measurement of said opening;

means for creating an said opening through said layer of insulation material, whereby a diameter of said layer of insulation material is dependent on a diameter of said opening created through said layer of etch resist material; and means, including a feedback mechanism, for assuring that said opening created through said layer of insulation material is within design specification.

10. The system of claim 9, wherein said means, including a feedback mechanism, for creating an opening, include means for making corrections to an original critical dimension measurement that is not within design specification.

\* \* \* \* \*